United States Patent [19]

Lautzenhiser et al.

[11] Patent Number: 5,527,627
[45] Date of Patent: Jun. 18, 1996

[54] INK COMPOSITION FOR AN ULTRA-THICK THICK FILM FOR THERMAL MANAGEMENT OF A HYBRID CIRCUIT

[75] Inventors: Frans P. Lautzenhiser, Noblesville; Dwadasi H. R. Sarma; Fred E. Richter, both of Kokomo; Carl W. Berlin, West Lafayette, all of Ind.

[73] Assignee: Delco Electronics Corp., Kokomo, Ind.

[21] Appl. No.: 342,966

[22] Filed: Nov. 21, 1994

Related U.S. Application Data

[63] Continuation-in-part of Ser. No. 38,379, Mar. 29, 1993, Pat. No. 5,395,679.

[51] Int. Cl.⁶ .......................................... B32B 9/00
[52] U.S. Cl. .......................... 428/615; 428/613; 428/620; 428/624; 428/626; 428/632; 428/637; 428/687; 428/209
[58] Field of Search ........................... 428/209, 613, 428/615, 624, 620, 626, 632, 637

[56] References Cited

U.S. PATENT DOCUMENTS 4,612,601  9/1986  Watari ................................. 361/387
5,121,298  6/1992  Sarma et al. ........................ 361/406
5,173,839  12/1992  Metz, Jr. ............................ 361/387

FOREIGN PATENT DOCUMENTS

0434264A2  6/1990  European Pat. Off. .

OTHER PUBLICATIONS

U.S. patent application Ser. No. 08/038,379. Myers et al., filed Mar. 29, 1993.
449—F&M Fienwerktechnik & Messtechnik 98 (1990) Nov., No. 11, Munchen, DE.

*Primary Examiner*—Patrick J. Ryan
*Assistant Examiner*—Cathy K. Lee
*Attorney, Agent, or Firm*—Mark A. Navarre

[57] ABSTRACT

An ink composition is provided for forming an ultra-thick thick film which is suitable for conducting heat laterally from a heat generating device supported on a substrate. The ink composition is formulated to enable the ultra-thick thick film to be formed as a single layer, such that only a single print, dry and fire cycle is required to form the film. Advantageously, ultra-thick thick films having thicknesses of about 125 micrometers (about 0.005 inch) and greater can be formed by a single layer of the ink composition.

9 Claims, 1 Drawing Sheet

5,527,627

INK COMPOSITION FOR AN ULTRA-THICK THICK FILM FOR THERMAL MANAGEMENT OF A HYBRID CIRCUIT

CROSS REFERENCE TO RELATED APPLICATIONS

This is a continuation-in-part patent application of co-pending U.S. patent application Ser. No. 08/038,379 filed Mar. 29, 1993, now U.S. Pat. No. 5,395,679.

FIELD OF THE INVENTION

This invention relates to ultra-thick thick films which are capable of conducting and dissipating heat for purposes of thermal management of semiconductor devices. More particularly, this invention relates to an ink composition for such an ultra-thick thick film, wherein the composition enables a thicker film to be produced by a single printing, drying and firing cycle, while achieving improved drying characteristics, cleaner binder burnoff and higher production yields.

BACKGROUND OF THE INVENTION

A variety of methods are known for dissipating heat in semiconductor devices. An existing method of heat dissipation employs a beryllium oxide (BeO) substrate which has a very high thermal conductivity. In addition, electrical currents may also be conducted by a refractory metallization and solder on the BeO substrate. Disadvantages of such systems include relatively high cost of manufacture, the toxic nature of BeO and relatively high electrical resistance of the refractory metallization. In fact, the use of BeO may not be practical in the near future due to anticipated environmental regulation.

Many thermal management methods for semiconductor applications are designed to dissipate heat primarily in the vertical, or "z" direction, underneath the heat generating device. For example, alumina substrates are often placed underneath the heat generating semiconductor chips so as to conduct and dissipate heat in the vertical direction away from the heat generating chip. Such designs are limited in their ability to dissipate heat laterally, i.e., in the "x" and "y" directions, because the thermal conductivity of an alumina substrate is low compared to metallic materials. Systems which are able to promote the lateral conduction and dissipation of heat have an advantage over systems which are primarily limited to conduction of heat only in the vertical direction. By conducting heat in the lateral directions, the cross-sectional area through which heat is conducted vertically is greater than the surface area directly under the heat dissipating device, such that a lower thermal resistance path is provided, resulting in an overall reduction of the device's operating temperature.

The use of ultra-thick thick films for dissipating heat is taught in U.S. patent application Ser. No. 08/038,379 to Myers et al. Whereas conventional thick films have a thickness in the range of about 13 to about 25 micrometers (about 0.0005 to about 0.001 inch), Myers et al. teach an ultra-thick thick film (UTTF) which can be formed to have a thickness of up to about 125 micrometers (about 0.005 inch). At such thicknesses, the ultra-thick thick film is highly suitable for use as a heat dissipating and current conducting system which is capable of conducting heat laterally (i.e., in the x and y directions) from a heat generating device.

In order to achieve such thicknesses, Myers et al. teach that the ultra-thick thick films are preferably composed of multiple layers of printed films. Each film layer is formed from an ink composition which includes about 80 to about 90 weight percent of a metal powder of copper, silver or other conductive material, with the balance of the composition being an inorganic binder and a screening agent. It is generally necessary to fire each layer separately in order to effect complete removal of the inorganic binder. The firing of relatively thick layers is generally impractical due to improper binder burnoff, which can have a detrimental effect on the solderability and/or adhesion strength of the film.

However, from the standpoint of processing and costs, it would be desirable if an ink composition were available that could form an ultra-thick thick film for conducting heat away from a semiconductor device, as taught by Myers et al., but would allow the film to be formed by a single printing, drying and firing operation. More particularly, such an ink composition would enable the formation of ultra-thick thick films having thicknesses of 125 micrometers and greater to be deposited as a single layer, which can then be fired during a single firing cycle to completely remove the binders in the ink composition and reliably yield a highly adherent film.

SUMMARY OF THE INVENTION

It is an object of this invention to provide an ink composition for forming an ultra-thick thick film which is suitable for use as a heat dissipating and conducting system, in that the ultra-thick thick film is capable of promoting the lateral conduction of heat from a heat generating device supported on a substrate.

It is a further object of this invention that a single layer of such an ink composition be capable of forming the ultra-thick thick film, such that only a single print, dry and fire cycle is required to form the film.

It is another object of this invention that such an ink composition be formulated to enhance the burnoff of binders within the composition in order to promote complete removal of the binders, and thereby promote the physical, solderability and adhesion characteristics of the film.

In accordance with a preferred embodiment of this invention, these and other objects and advantages are accomplished as follows.

According to the present invention, there is provided an ink composition for an ultra-thick thick film (UTTF) which is used to conduct heat laterally, in the x and y directions, from a heat generating semiconductor device and to an underlying substrate. The ink composition is formulated to enable the ultra-thick thick film to be formed as a single layer, such that only a single print, dry and fire cycle is required to form the film. Advantageously, ultra-thick thick films having thicknesses of about 125 micrometers (about 0.005 inch) and greater can be formed by a single layer of the ink composition.

In use, an ultra-thick thick film formed in accordance with this invention is deposited on the surface of a substrate whose thickness is suitably chosen to dissipate heat in the vertical or z direction. The ultra-thick thick film provides for a larger cross-sectional area for lateral heat conduction than do conventional metallizations. The ultra-thick thick film is also capable of providing an electrical path whose conductivity is up to about eight times higher than that of conventional silver thick films. This is achieved with the thick film material, and as such eliminates special discrete power busses, high cost metal core substrate materials, or high cost metallization techniques. The combination of high thermal conductivity and electrical conductivity substantially enhances the capability of alumina-based thick-film circuits for use in high-power applications.

To achieve the above-stated capabilities, the ink composition is preferably composed of a powder mixture and an organic binder mixture which has been dissolved in a suitable solvent. The powder mixture preferably constitutes about 87 to about 94 weight percent of the ink composition, and includes a silver powder having an effective surface area of not greater than about 0.35 square meters/gram so as to promote the porosity of the ink composition. As a result, the decomposition byproducts of the binder constituents of the organic binder mixture are more readily able to escape from the ink composition during firing, such that the solderability and adhesion characteristics of the resulting film are preserved.

The organic binder mixture is composed of at least two organic binders, one of which having a lower burnoff temperature than the other, so as to further facilitate the escape of the organic binders from the ink composition during firing. The organic binder mixture also preferably includes two or more solvents, one of which is preferably present in a greater amount than the other and has a higher vapor pressure than the other, so as to promote desirable drying characteristics for the composition prior to firing.

The above formulation yields an ink composition which can be printed as a single layer, instead of multiple layers, to form an ultra-thick thick film. In particular, the ink composition of this invention facilitates processing and reduces the cost of forming ultra-thick thick films having thicknesses on the order of about 125 micrometers and greater, yet reliably yields a highly adherent film which is suitable for conducting heat away from a semiconductor device in accordance with the teachings of Myers et al.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
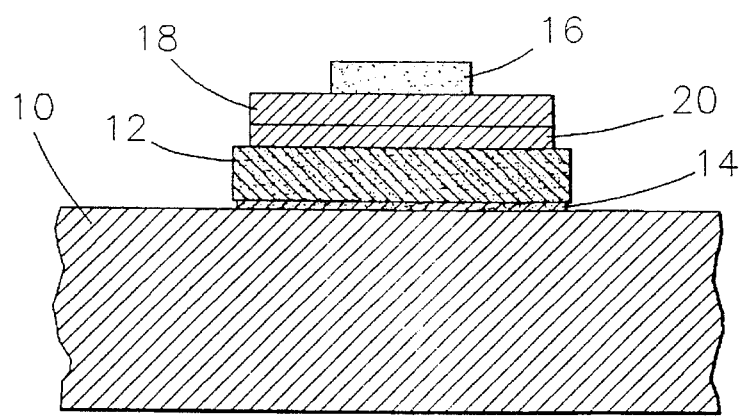
FIG. 1 shows a microelectronics structure which employs an ultra-thick thick film of a type formed from an ink composition of this invention.

FIG. 1 shows a heat dissipating system for a heat generating semiconductor device 16. The heat dissipating system includes an aluminum backplate 10 on which is supported an alumina substrate 12, an ultra-thick thick film 20 formed in accordance with this invention, and a solder layer 18. The solder layer 18 serves to adhere the device 16 to the ultra-thick thick film 20, while an adhesive layer 14 serves to adhere the alumina substrate 12 to the backplate 10. The film 20 is self-adherent to the alumina substrate 12. The above structure is generally in accordance with the teachings of U.S. patent application Ser. No. 08/038,379 to Myers et al.

The aluminum backplate 10 typically has a thickness ranging from about one to about six millimeters (about 0.05 to about 0.25 inch), and can be formed from any suitable aluminum or aluminum alloy. The solder layer 18 can be formed by any conventional Sn-Pb solder material, typically with a tin to lead weight ratio of about 25/75. A suitable composition for forming a Sn-Pb solder layer 18 is manufactured by Delco Electronics, though other suitable compositions are commercially available. In a preferred embodiment, the solder layer 18 has a thickness ranging from about 25 to about 180 micrometers (about 0.001 to about 0.007 inch). The alumina substrate 12 is preferably a 96 percent aluminum oxide of a type available from Coors Ceramics Company. The alumina substrate 12 may have a thickness ranging from about 250 to about 900 micrometers (about 0.010 to about 0.035 inch), and preferably about 380 to about 900 micrometers (about 0.015 to about 0.035 inch). The thickness of the alumina substrate 12 is chosen to optimize mechanical strength and electrical isolation with good thermal performance.

The adhesive layer 14 is preferably formed from a silicone resin in which a thermally conductive material is dispersed. Such an adhesive is available from Dow Corning Company under the names DC 6843 and DC 6325. The adhesive layer 14 may be applied in a thickness ranging from about 50 to about 180 micrometers (about 0.002 to about 0.007 inch), though preferably on the order of about 125 micrometers (about 0.005 inch). The thickness of the adhesive layer 14 is chosen so that the adhesive serves to mechanically attach the alumina substrate 12 to the backplate 10, relieve stresses due to differences in thermal coefficients of expansion between the alumina substrate 12 and the backplate 10, and contribute minimal resistance to heat transfer between the alumina substrate 12 and the backplate 10.

In accordance with Myers et al., the characteristics of the above-described heat dissipating system are such that heat is conducted not only in the vertical or z direction from the device 16 to the backplate 10, but also in the lateral or x and y directions along the ultra-thick thick film 20. As such, the cross-sectional area through which heat is conducted vertically toward the backplate 10 is significantly greater than the surface area of the lower surface of the heat dissipating device 16. As such, a lower thermal resistance path is provided, resulting in an overall reduction in the operating temperature of the device 16.

Contrary to Myers et al., the ultra-thick thick film 20 of this invention is not formed from multiple layers, but instead is formed from a single layer of an ink composition which can be deposited, dried and fired to form the ultra-thick thick film 20, even if the film 20 is to have a final thickness of 125 micrometers or more. To achieve this result, the ink composition of this invention is formulated to include a powder mixture composed of at least one and preferably two silver powders, and an organic binder mixture composed of at least two organic binders, one of which having a lower burnoff temperature than that of the other. Additional preferred constituents of the ink composition include one or more inorganic oxide binders, such as copper or bismuth oxide.

The amount of silver powder present in the composition may range from about 87 to about 94 weight percent of the total ink composition, with a preferred amount being about 89 weight percent. As noted above, the powder mixture is selected to enable the organic binders of the ink composition to escape during the firing operation. For this purpose, at least one of the silver powders is a coarse powder whose particle size distribution yields an effective surface area of not greater than about 0.35 square meter per gram of powder, so as to promote porosity in the ink composition. A silver powder obtained from the Degussa Corporation as Ag-powder FD, has been found to be suitable for this purpose. This silver powder has a particle size ranging from about 12 to about 50 microns, yielding an effective surface area of about 0.14 square meter/gram. The individual particles of the preferred silver powder generally resemble agglomerations of spherical particles. This coarse powder preferably accounts for about 25 to about 75 weight percent of the powder mixture, so as to constitute about 23 to about 68 weight percent of the ink composition, with a preferred constituency being about 25 to about 50 weight percent of the ink composition.

A second preferred silver powder for the powder mixture is composed of finer particles, so as to improve packing efficiency and sintering properties of the ink composition, as will be discussed below. The second silver powder preferably has an effective surface area of greater than about 0.6 square meter/gram. A preferred silver powder is commercially available as SFC-20ED from the Degussa Corporation, and has a relatively broad distribution of particle sizes, ranging from about 0.3 to about 5 microns, yielding an effective surface area of about 0.86 square meter/gram. The individual particles of this particular powder are generally irregularly shaped. This finer powder accounts for the remainder of the powder mixture, so as to constitute about 20 to about 60 weight percent of the ink composition, with a preferred amount being about 38 to about 58 weight percent of the ink composition.

The organic binder mixture of this invention also uniquely serves to promote the ability to form the ultra-thick thick film 20 as a single layer. In a preferred embodiment, the binder mixture includes two or more binders, one of which having a significantly lower burnoff temperature than the other, two or more solvents, one of which having a higher vapor pressure than the other, a screening agent and a surfactant. The organic binder mixture preferably constitutes about 6 to about 13 weight percent of the ink composition, with a preferred amount being about 7 to about 10 weight percent of the ink composition.

As is generally conventional for thick films known in the art, ethyl cellulose is highly suitable for use as one of the binders in the ink composition. Ethyl cellulose, and preferably those having a viscosity type in the range of about 10 to about 50 per ASTM D914, produce an ink composition having a viscosity which is appropriate for use in printing techniques, such as stencil or screen printing. Ethyl cellulose is preferably present in the binder mixture in amounts of about 2 to about 8 weight percent, and more preferably about 4 weight percent.

The second binder is selected in part on the basis of having a lower burnoff temperature than that of ethyl cellulose, for the purpose of reducing the amount of burnoff at any given temperature during the firing cycle, and thereby expanding the burnoff temperature range for the ink composition. While various binder compositions could foreseeably be used for this purpose, a preferred binder is an acrylic resin available commercially from DuPont under the name 2045 ELVACITE. This binder is preferably present in the binder mixture in amounts of about 1 to about 8 weight percent, and more preferably about 3 weight percent.

While additional binder constituents can be employed in the ink composition, in a preferred embodiment, a screening agent is used which, in addition to serving as a binder, contributes a suitably paste-like consistency to the ink composition for the printing operation. A preferred screening agent is commercially available from DuPont Electronics under the name DP 9164, and is primarily a mixture of about 15 weight percent ethylene/vinyl acetate, an organic binder, dissolved in diethylene glycol dibutyl ether. Advantageously, diethylene glycol dibutyl ether promotes desirable drying characteristics for the ink composition. This screening agent is preferably present in the binder mixture in amounts of about 5 to about 50 weight percent, and more preferably about 16 weight percent. Advantageously, the preferred screening agent has been found to enhance the durability, toughness and crack-resistance of the ink composition.

In order to appropriately dissolve the binders of the ink composition, one or more solvents are preferably used. As is conventional for thick films known in the art, terpineol-based solvents are desirable for use in the present ink composition as a result of their ability to slow the drying process after the ink composition has been printed in order to prevent the ink composition from cracking. A preferred terpineol-based solvent is available commercially from DuPont Electronics under the name DP 8250, and is preferably present in the binder mixture in amounts of about 5 to about 50 weight percent, and more preferably about 18 weight percent.

However, the present invention further includes additions of one or more solvents whose vapor pressures are higher than that of terpineol and the preferred terpineol-based solvent for the purpose of slightly increasing the drying rate of the ink composition. It is also preferable that one or the combination of these solvents is present in the binder mixture in a greater amount than the terpineol-based solvent. A first preferred solvent is benzyl alcohol, present in the binder mixture in amounts of about 15 to about 75 weight percent, and more preferably about 50 weight percent. A second preferred solvent is dodecyl alcohol, present in the binder mixture in amounts of about 2 to about 8 weight percent, and more preferably about 4 weight percent. Advantageously, dodecyl alcohol has been found to work together with ethyl cellulose and the preferred acrylic resin to enhance the blemish resistance of the ink composition, as well as serve as a lubricant for the printing operation.

The remainder of the binder mixture is a surfactant, a suitable example of which is nonylphenol ethoxylated polyethylene glycol, preferably present in the binder mixture in amounts of about 2 to about 6 weight percent, and more preferably about 5 weight percent.

The remainder of the ink composition used to form the ultra-thick thick film 20 of this invention is an inorganic oxide binder present in an amount of up to about four weight percent. Preferred oxide binders are bismuth oxide and copper oxide powders, present within the ink composition at about 0.7 and about 1.4 weight percent, respectively, or a total of approximately two weight percent of the ink composition.

As noted above, the ultra-thick thick film 20 is capable of being formed by a single printing of the ink composition of this invention. The ink composition can be prepared using conventional techniques known to those skilled in the art, and preferably includes a roll milling operation to suitably mix the powder mixture with the organic binder mixture and the inorganic binders. Due to the tendency for the coarser silver powder to flatten and plate during roll milling, the coarser powder is preferably added after the other ingredients have been sufficiently roll milled at typical pressures. Thereafter, the coarser silver powder is admixed into the roll milled mixture, with minimal pressure being applied in order to assure mixing but avoid crushing the particles of the coarser powder.

The ink may then be printed onto the alumina substrate 12 using a stencil printing technique, though other printing techniques could alternatively be used. Thereafter, the ink composition is dried for a duration sufficient to allow handling, and then fired in an air atmosphere at a temperature ranging from about 600° C. to about 950° C., with a preferred peak temperature of about 850° C., to burnoff the binder mixture and transform the ink composition into the desired ultra-thick thick film 20.

As discussed above, the ink composition is formulated to be sufficiently porous to facilitate the escape of the organic binder mixture from the ink composition during the firing operation, and also to have a higher packing efficiency than conventional thick film inks. As is well known to those skilled in the art, the thickness of the ultra-thick thick film 20 decreases during the firing operation as a result of the film 20 becoming more dense due to removal of the binder mixture and subsequent sintering of the powder particles. Testing has determined that the thickness of an ultra-thick thick film formed with the ink composition of this invention is generally about 50 percent of the wet thickness of the ink prior to firing. While such a decrease is notable, the ink composition of this invention can be printed at thicknesses of greater than 250 micrometers, yielding ultra-thick thick films 20 having thicknesses of 125 micrometers and more. This result is contrary to prior art ink compositions, whose resulting ultra-thick thick films have a thickness on the order of about 30 percent of the as-printed thickness of the ink composition. In addition, the printed thickness of the ink composition is typically limited to not more than about 200 micrometers in order to assure complete removal of the binder, yielding an ultra-thick thick film whose thickness is typically not more than about 60 micrometers. As a result, several print, dry and fire operations are required in order to form suitable ultra-thick thick films from prior art ink compositions.

For comparison, a commercially available silver ink composition available under the name DP 6160 from DuPont Electronics, was tested in an identical manner with a preferred formulation for the ink composition of this invention, identified as Sample A. The precise formulation of the DP 6160 ink composition is proprietary to DuPont, though from published information it is known to be composed of at least about 60 weight percent silver powder, between about 1 and about 5 weight percent inorganic binder, and between about 1 and about 5 weight percent ethyl cellulose as an organic binder.

The Sample A ink composition of this invention was formulated to contain about 62 weight percent of the finer silver powder (SFC-20ED), about 29 weight percent of the coarser silver powder (Ag-powder FD), about 1.4 weight percent copper oxide, about 0.7 weight percent bismuth oxide, and about 7.2 weight percent of the organic binder mixture of this invention. The organic binder mixture was formulated to contain about 50 weight percent benzyl alcohol, about 18 weight percent of the preferred terpineol-based solvent (DP 8250), about 16 weight percent of the preferred screening agent (DP 9164), about 5 weight percent of the preferred surfactant (nonylphenol ethoxylated polyethylene glycol), about 4 weight percent dodecyl alcohol, about 4 weight percent of an ethyl cellulose having a molecular weight of about 50, and about 3 weight percent of the preferred acrylic resin binder (2045 ELVACITE).

For testing purposes, the ink compositions were deposited in a single operation onto a 96 percent alumina substrate in thicknesses ranging from about 200 to about 450 micrometers and then, to simulate a worst case scenario, fired without drying at a temperature of about 850° C. After firing, the resulting ultra-thick thick films were examined for flaws, and the thicknesses of the films were measured, with the results as follows:

TABLE I

| INK COMP. | AVERAGE SHRINKAGE (percent of wet thickness) | THICKEST FIRED FILM WITHOUT FLAWS |
|---|---|---|
| DP 6160 | 68 | 81 μm |
| Sample A | 48 | 236 μm |

As can be seen from the above results, the ink composition of this invention was capable of successfully forming ultra-thick thick films having a thickness of nearly three times greater than that possible with the prior art ink composition. Furthermore, the failure modes of the two films were different. The thinnest DP 6160 films to exhibit an unacceptable blemish tended to have tears which exposed the underlying substrate. At greater thicknesses, the films formed by the DP 6160 composition tended to lift off the substrate. In contrast, the Sample A ink composition of this invention did not show signs of tearing, but instead tended to separate from the substrate along the perimeter of the film at thicknesses of about 240 micrometers or more.

Figure 2:
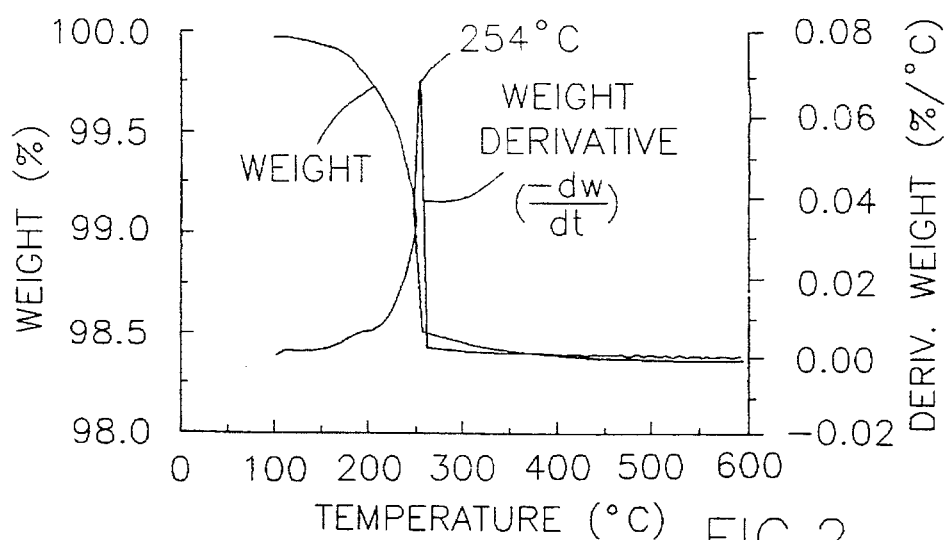
FIGS. 2 and 3 graphically illustrate the burnoff characteristics of the ink composition of this invention and an ink composition known in the prior art, respectively.
Figure 3:
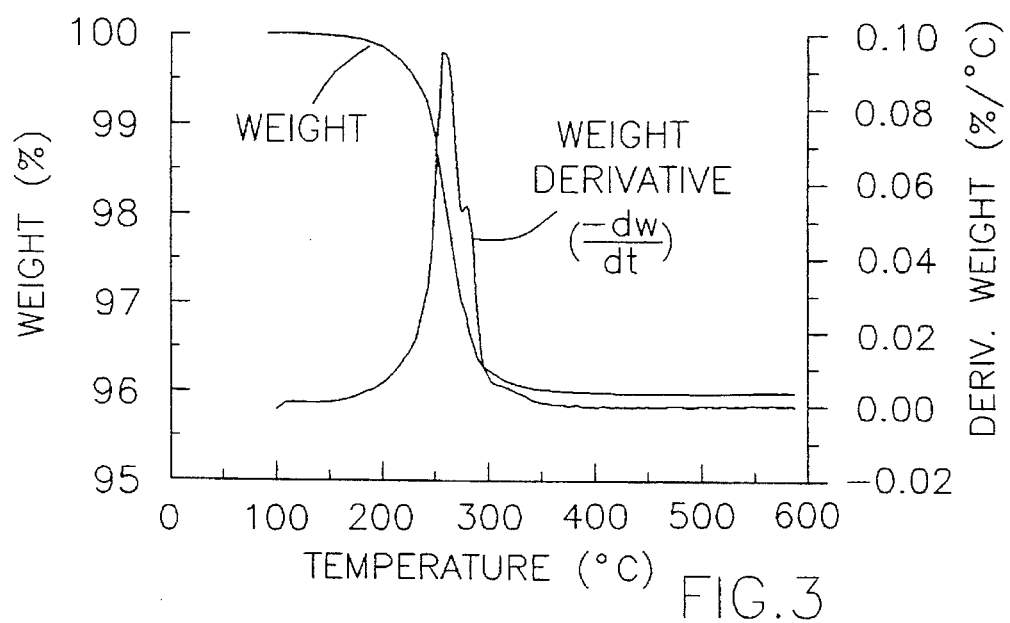

Thermo-gravimetric analysis (TGA) was performed on dried films of both ink compositions, with samples of about 30 to 35 milligrams. The heating rate was about 20° C./minute between about 100° C. and about 600° C. FIG. 2 represents the results of the analysis on the Sample A ink composition of this invention, while FIG. 3 represents the results of the analysis on the DP 6160 commercial ink composition.

Based on the wider temperature range over which binder burnoff occurred in the DP 6160 sample, the results suggest that the DP 6160 ink composition may contain nearly three times as much organic binder as the Sample A ink composition of this invention. The results also indicate that, despite the use of three organic binders in the Sample A ink composition (the screening agent, ethyl cellulose and the acrylic resin), burnoff occurred over a much shorter range for the Sample A ink composition than for the DP 6160 ink composition. Such a desirable characteristic was believed to be due to the increased porosity of the Sample A ink composition as a result of the inclusion of the coarser silver powder, which has a dominant effect on the ability to successfully dry and fire films of greater thicknesses.

Furthermore, the burnoff temperature for ethyl cellulose appeared to be up to about 50° C. higher in the DP 6160 ink composition than in the Sample A ink composition, presumably because the DP 6160 ink is much denser, delaying the escape of the decomposition byproducts of ethyl cellulose from the ink. If the heating rate for the analysis were decreased from the 20° C./minute used, the ethyl cellulose burnoff characteristics for the two ink compositions might agree more closely. However, to achieve suitable production rates, production firing equipment typically operate at about 100° C./minute, suggesting that the incidence of faults in ultra-thick thick films formed from the DP 6160 ink composition would increase under more typical production conditions, as compared to films formed with the ink composition of this invention.

From the above, it can be seen that the present invention provides an ink composition which enables an ultra-thick thick film having a thickness of 125 micrometers or more to be formed by a single printing, drying and firing cycle, instead of multiple layers as required by ink compositions of the prior art. Generally, it is believed that the use of less organic binder and coarser silver powders both contribute to the substantial improvements noted above. Furthermore, it is believed that the use of two or more binders having different burnoff properties and which decompose at different temperatures, particularly at temperatures less than the decomposition temperature of ethyl cellulose, also contribute to the desirable results described above.

In addition, as a result of the ability to form thicker ultra-thick thick films using a single print, dry and fire cycle, the ink composition of this invention significantly facilitates processing and reduces the material and production costs entailed in the forming of ultra-thick thick films. In particular, lower processing costs are achieved as a result of the broadened process window obtained through the use of higher solids content and the use of a coarser silver powder, tougher binders and solvents with higher vapor pressures.

Finally, and in accordance with the teachings of Myers et al., such films are suitably adapted for reducing the operating temperature of a semiconductor devices mounted to a substrate by promoting the conduction of heat laterally from the device.

While our invention has been described in terms of a preferred embodiment, it is apparent that other forms could be adopted by one skilled in the art, for example by modifying the processing parameters or by substituting appropriate materials. Accordingly, the scope of our invention is to be limited only by the following claims.

The embodiments of the invention in which an exclusive property or privilege is claimed are defined as follows:

1. An ink composition for an ultra-thick thick film which is suitable for conducting heat laterally from a semiconductor device, said ink composition comprising:

a powder mixture comprising a first silver powder having a surface area of not greater than about 0.35 square meter/gram and a second silver powder having a surface area of greater than about 0.6 square meter/gram, said first silver powder promoting porosity in said ink composition;

an inorganic oxide binder;

an organic binder mixture comprising a first organic binder, a second organic binder, a terpineol-based solvent, a second solvent having a higher vapor pressure than said terpineol-based solvent, a screening agent and a surfactant, said second organic binder having a lower burnoff temperature than said first organic binder, said second solvent being present in said organic binder mixture in a greater amount than said terpineol-based solvent;

whereby said ink composition is sufficiently porous to facilitate the escape of decomposition byproducts of said first and second organic binders from said ink composition during firing of said ink composition.

2. An ink composition as recited in claim 1 wherein said powder mixture constitutes about 87 to about 94 weight percent of said ink composition.

3. An ink composition as recited in claim 1 wherein said powder mixture comprises about 25 to about 75 weight percent of said first silver powder and about 25 to about 75 weight percent of said second silver powder.

4. An ink composition as recited in claim 1 wherein said inorganic binder constitutes up to about 4 weight percent of said ink composition.

5. An ink composition as recited in claim 1 wherein said inorganic binder is at least one compound selected from the group consisting of copper oxide and bismuth oxide.

6. An ink composition as recited in claim 1 wherein said organic binder mixture constitutes about 6 to about 13 weight percent of said ink composition.

7. An ink composition as recited in claim 1 wherein said organic binder mixture comprises about 2 to about 8 weight percent of said first organic binder, about 1 to about 8 weight percent of said second organic binder, about 5 to about 50 weight percent of said terpineol-based solvent, about 15 to about 75 weight percent of said second solvent, about 5 to about 50 weight percent of said screening agent, and about 2 to about 6 weight percent of said surfactant.

8. An ink composition as recited in claim 1 wherein said first organic binder is ethyl cellulose.

9. An ink composition as recited in claim 1 wherein said second organic binder is an acrylic resin.

\* \* \* \* \*